United States Patent
Gardner et al.

(10) Patent No.: US 12,317,577 B2
(45) Date of Patent: May 27, 2025

(54) 3D SEMICONDUCTOR DEVICE WITH 2D SEMICONDUCTOR MATERIAL AND METHOD OF FORMING THE SAME

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 792 days.

(21) Appl. No.: 17/546,755

(22) Filed: Dec. 9, 2021

(65) Prior Publication Data

US 2023/0187280 A1 Jun. 15, 2023

(51) Int. Cl.
| | |
|---|---|
| *H10B 43/30* | (2023.01) |
| *H10B 41/27* | (2023.01) |
| *H10D 30/67* | (2025.01) |
| *H10D 84/03* | (2025.01) |
| *H10D 88/00* | (2025.01) |

(52) U.S. Cl.
CPC ......... *H10D 84/038* (2025.01); *H10B 41/27* (2023.02); *H10B 43/30* (2023.02); *H10D 30/6757* (2025.01); *H10D 88/00* (2025.01); *H10D 88/01* (2025.01)

(58) Field of Classification Search
CPC .............................. H10B 43/30; H10D 84/038
See application file for complete search history.

(56) References Cited

U.S. PATENT DOCUMENTS

| | | | |
|---|---|---|---|
| 2017/0200820 A1* | 7/2017 | Conway | ............... H10D 30/831 |
| 2020/0013791 A1* | 1/2020 | Or-Bach | ............. G11C 11/5628 |

* cited by examiner

*Primary Examiner* — Douglas M Menz
(74) *Attorney, Agent, or Firm* — Oblon, McClelland, Maier & Neustadt, L.L.P.

(57) ABSTRACT

A semiconductor device includes a stack of layers defining a sidewall surface and comprising source and drain layers. A channel structure extends through the stack of layers, is oriented in a vertical direction perpendicular to a main surface of the stack of layers, and is configured to have a current flow path in the vertical direction. The channel structure includes a two-dimensional (2D) semiconductor material. A core structure is positioned inside and surrounded by the channel structure, and a gate structure surrounds at least part of the channel structure.

20 Claims, 6 Drawing Sheets

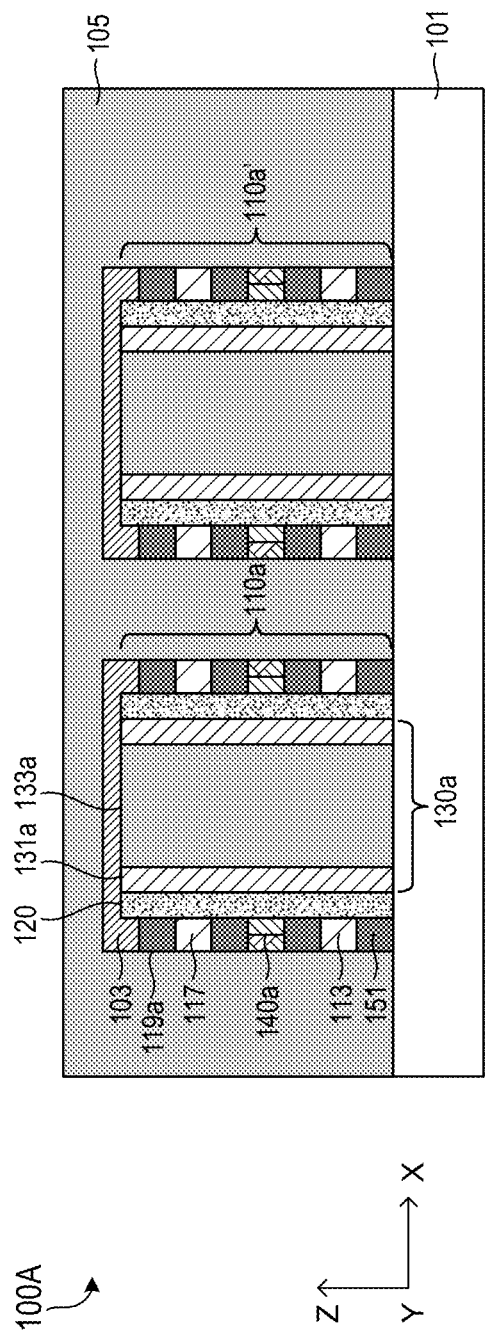
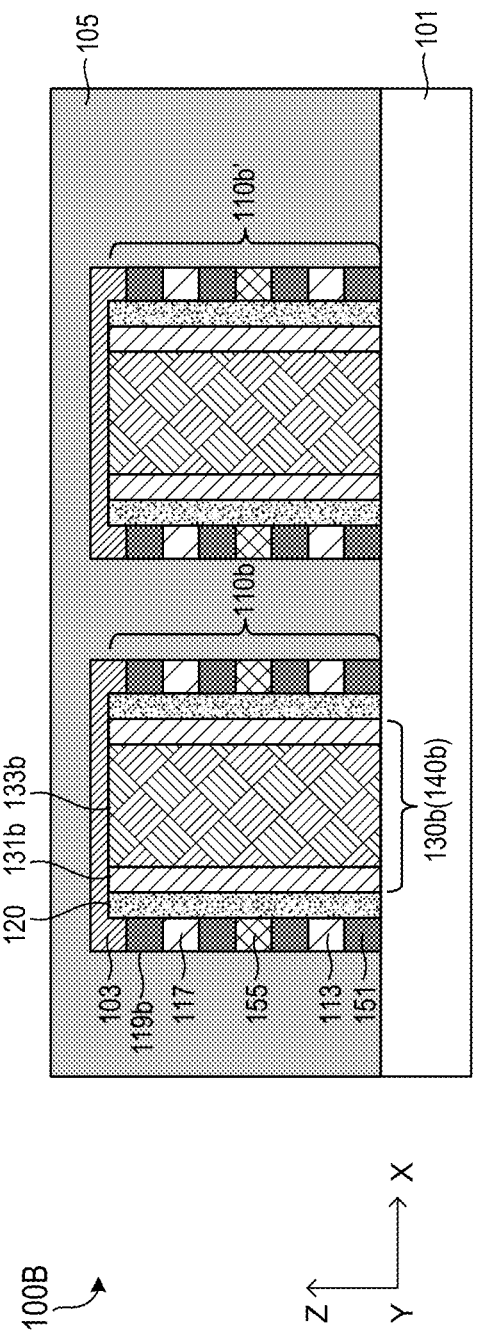

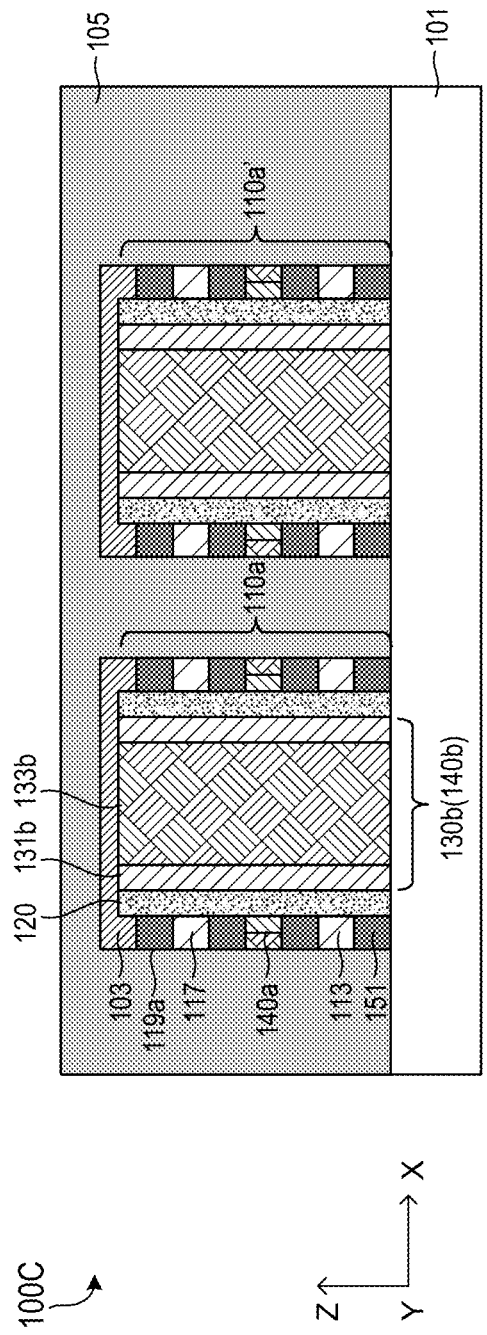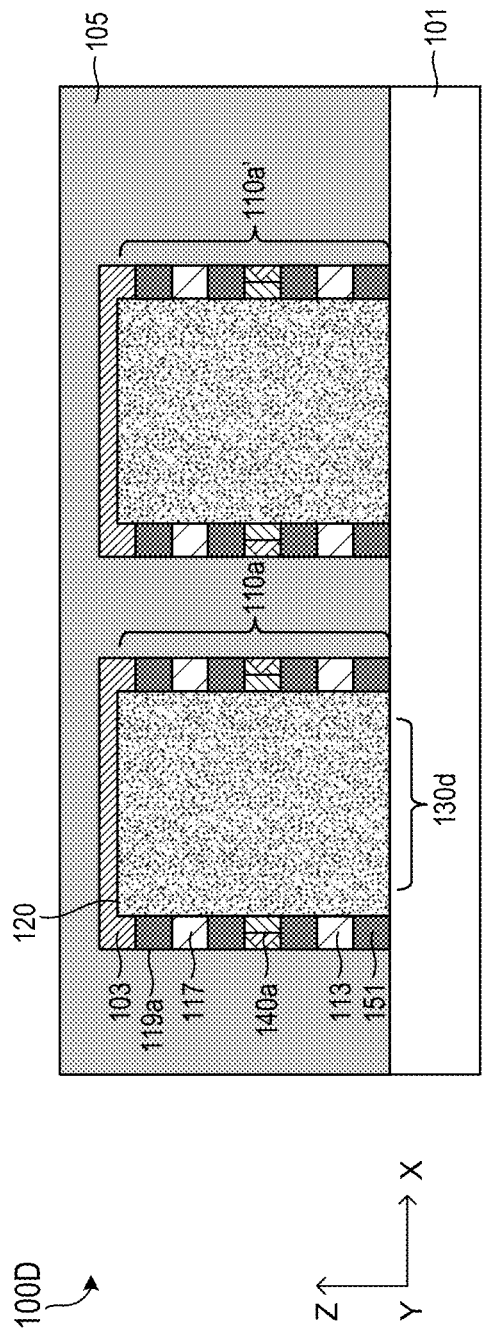

3D SEMICONDUCTOR DEVICE WITH 2D SEMICONDUCTOR MATERIAL AND METHOD OF FORMING THE SAME

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of forming the same.

Aspect (1) includes a semiconductor device. The semiconductor device includes a stack of layers defining a sidewall surface and including source and drain layers. A channel structure extends through the stack of layers, is oriented in a vertical direction perpendicular to a main surface of the stack of layers, and is configured to have a current flow path in the vertical direction. The channel structure includes a two-dimensional (2D) semiconductor material. A core structure is positioned inside and surrounded by the channel structure, and a gate structure surrounds at least part of the channel structure.

Aspect (2) includes the semiconductor device of aspect (1), wherein the core structure includes a dielectric core inside the channel structure.

Aspect (3) includes the semiconductor device of aspect (1), wherein the core structure includes the 2D semiconductor material.

Aspect (4) includes the semiconductor device of aspect (1), wherein the core structure includes an inner gate structure of the gate structure surrounding the channel structure from within.

Aspect (5) includes the semiconductor device of aspect (1), wherein the gate structure includes an outer gate structure surrounding part of the channel structure from outside.

Aspect (6) includes the semiconductor device of aspect (1), wherein the channel structure includes one or more monolayers of the 2D semiconductor material. The one or more monolayers are stacked in a horizontal direction parallel to the main surface of the stack of layers.

Aspect (7) includes the semiconductor device of aspect (1), wherein the 2D semiconductor material includes at least one of hexagonal boron nitride, a carbon-based material, a semiconducting oxide or a metal chalcogenide.

Aspect (8) includes the semiconductor device of aspect (7), wherein the carbon-based material includes graphene. The semiconducting oxide includes at least one of ZnO, CdO or $In_2O_3$. The metal chalcogenide includes at least one of $WS_2$, $WSe_2$, $WTe_2$, $MoS_2$, $MoSe_2$, $MoTe_2$, $HfS_2$, $ZrS_2$, $TiS_2$, GaSe, InSe or $TiS_3$.

Aspect (9) includes the semiconductor device of aspect (1), further including a base positioned immediately below the channel structure. The base includes a dielectric material or a semiconductor material.

Aspect (10) includes the semiconductor device of aspect (1), wherein the gate structure includes a work function metal (WFM) and a gate dielectric positioned between the WFM and the channel structure.

Aspect (11) includes a method of fabricating a semiconductor device. The method includes forming a stack of layers which defines a sidewall surface and includes source and drain layers. A channel structure is formed that extends through the stack of layers, is oriented in a vertical direction perpendicular to a main surface of the stack of layers, and is configured to have a current flow path in the vertical direction. The channel structure includes a two-dimensional (2D) semiconductor material. A core structure is formed that is positioned inside and surrounded by the channel structure. A gate structure is formed that surrounds at least part of the channel structure.

Aspect (12) includes the method of aspect (11), further including forming the channel structure on a sidewall of a hole that extends through the stack of layers.

Aspect (13) includes the method of aspect (12), further including filling the hole with the core structure.

Aspect (14) includes the method of aspect (13), further including forming the core structure by forming an inner gate structure of the gate structure inside the channel structure.

Aspect (15) includes the method of aspect (13), further including forming the core structure by forming a dielectric core inside the channel structure.

Aspect (16) includes the method of aspect (13), further including forming the core structure by forming the 2D semiconductor material inside the channel structure.

Aspect (17) includes the method of aspect (12), further including forming an initial stack of layers including sacrificial layers and dielectric layers. The sacrificial layers are separated from each other by the dielectric layers. The initial stack of layers is directionally etched through to form the hole.

Aspect (18) includes the method of aspect (17), further including directionally etching the initial stack of layers to form at least one independent stack which defines an initial sidewall surface. The sacrificial layers are replaced, from the initial sidewall surface, with the source and drain layers or with the source and drain layers and an outer gate structure of the gate structure.

Aspect (19) includes the method of aspect (12), further including forming the channel structure by forming one or more monolayers of the 2D semiconductor material on the sidewall of the hole.

Aspect (20) includes the method of aspect (11), further including forming the stack of layers on a base which includes a dielectric material or a semiconductor material.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A shows a vertical cross-sectional view of a semiconductor device, in accordance with one embodiment of the present disclosure.

FIG. 1B shows a vertical cross-sectional view of a semiconductor device, in accordance with another embodiment of the present disclosure.

FIG. 1C shows a vertical cross-sectional view of a semiconductor device, in accordance with yet another embodiment of the present disclosure.

FIG. 1D shows a vertical cross-sectional view of a semiconductor device, in accordance with yet another embodiment of the present disclosure.

DETAILED DESCRIPTION

Figure 2:
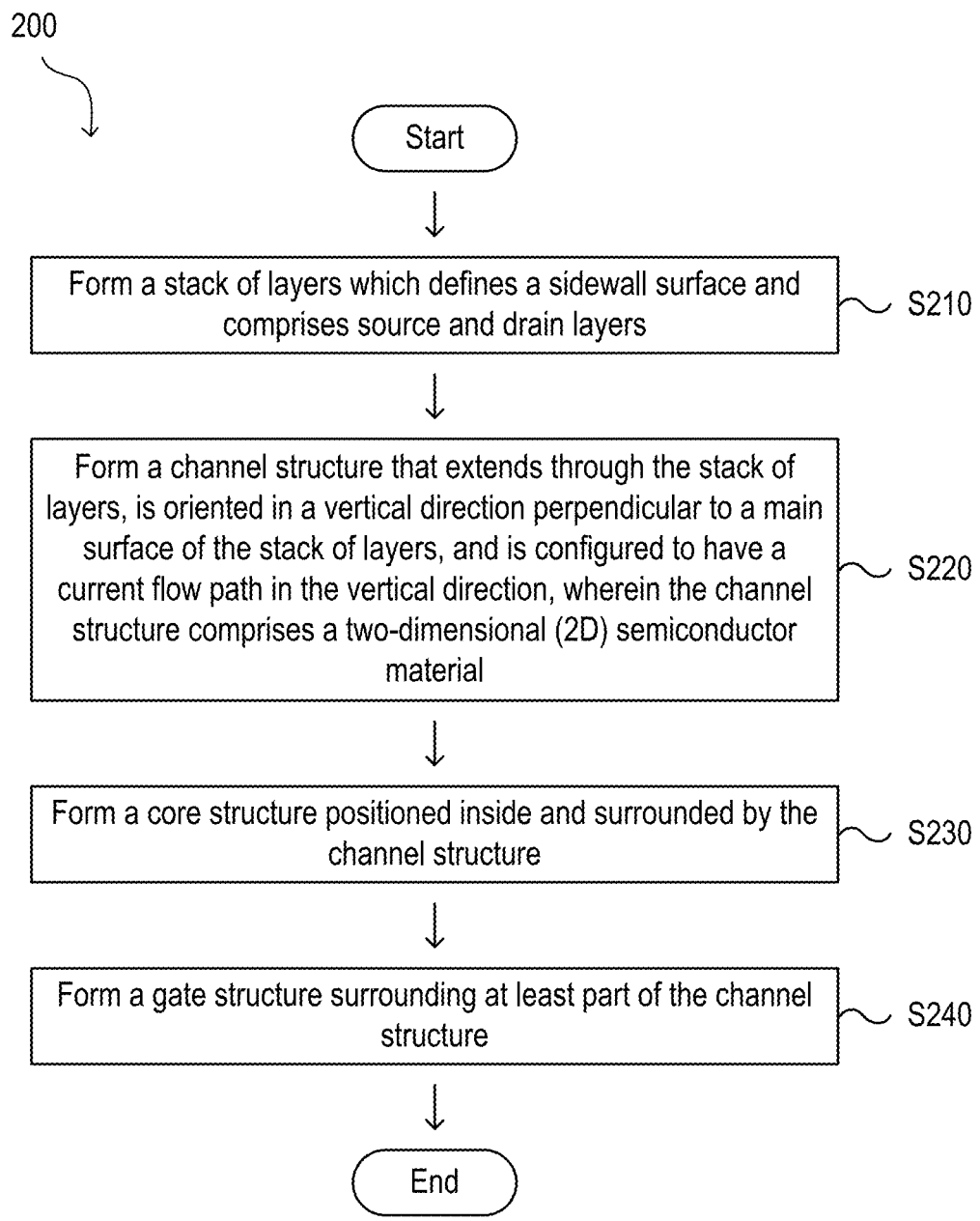
FIG. 2 shows a flow chart of a process for manufacturing a semiconductor device, in accordance with exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (e.g. CPU (central processing unit), GPU (graphics processing unit), FPGA (field programmable gate array, SoC (System on a chip), etc.) is being pursued.

Techniques herein include a transistor device with a vertical channel including a two-dimensional (2D) semiconductor material. The vertical channel includes one or more monolayers of the 2D semiconductor material stacked horizontally, with each monolayer oriented in a vertical direction. Ergo, the vertical channel can be disposed on a dielectric or semiconductor substrate. Techniques herein enable 2D semiconductor materials, which are high mobility materials, to be utilized in 3D horizontal stacking of semiconductor devices with enhanced device performance and without necessarily using a semiconductor base.

Techniques herein provide a method of forming at least one transistor device with a vertical channel including a 2D semiconductor material. The method enables the 2D material semiconductor, a (high-k) gate dielectric and a metal gate electrode to be done as a starting stack. Thus, a robust efficient process flow is established with fewer process steps. Techniques herein allow for additional transistors to be integrated 3D with using a low Dt process (e.g. a low temperature process where a maximum temperature is below 600° C., or even lower, for all processing steps) for high mobility. Note that formation of the vertical channel is not necessarily accomplished by, thus not limited to, epitaxial growth. In one embodiment, the vertical channel, or rather the at least one transistor device, is formed on a dielectric substrate. In another embodiment, the vertical channel is formed on a semiconductor substrate.

According to some aspects of the present disclosure, contact structures (e.g. vertical contact structures) to source and drain layers and a gate structure of the at least one transistor device can be formed, for example by methods disclosed in the applicant's patent application titled "3D SEMICONDUCTOR DEVICE AND METHOD OF FORMING THE SAME" (Ser. No. 17/546,785), which is incorporated herein by reference in its entirety. Further, the at least one transistor device can be stacked in a vertical direction with a high density. Examples of stacking transistor devices in the vertical direction can be found in the above-mentioned reference and U.S. Ser. No. 17/094,947, the contents of which are hereby incorporated by reference in their entirety.

FIG. 1A shows a vertical cross-sectional view of a semiconductor device 100A in accordance with one embodiment of the present disclosure. The semiconductor device 100A includes at least one stack (e.g. 110a and 110a') of layers including source and drain layers (also referred to as S/D layers). A channel structure 120 (also referred to as a vertical channel structure 120) is oriented in a vertical direction (e.g. the Z direction) and is configured to have a current flow path in the vertical direction. The channel structure 120 includes one or more two-dimensional (2D) semiconductor materials, which will be explained in detail later. The semiconductor device 100A further includes a core structure 130a positioned inside and surrounded by the channel structure 120. Therefore, the channel structure 120 is also referred to as a shell structure 120.

In this example, only two stacks 110a and 110a' of layers are shown for illustrative purposes and separated from each other by an insulating layer 105. Since the two stacks of layers illustrated are similar to each other, descriptions will be focused on the stack 110a of layers (also referred to as the stack 110a). As shown, the stack 110a includes S/D layers 113 and 117, an outer gate structure 140a and dielectric layers 151. The dielectric layers 151 separate the S/D layers 113 and 117 and the outer gate structure 140a from each other. The outer gate structure 140a includes one or more work function metals (WFMs) and one or more gate dielectrics (e.g. high-k dielectrics), with the one or more gate dielectrics sandwiched between the one or more WFMs and the channel structure 120. The stack 110a can also include a capping layer 103, which may extend over a top surface of the stack 110a. Note that the stack 110a of layers defines a sidewall surface 119a. The sidewall surface 119a can have a circular, elliptical, polygonal or any irregular shape in a plane (e.g. the XY plane) parallel to a main surface of the stack 110a of layers.

As shown in FIG. 1A, the channel structure 120 extends through the stack 110a of layers. While not shown, the channel structure 120 is positioned within and surrounded by the stack 110a of layers. As a result, the outer gate structure 140a surrounds part of the channel structure 120 from outside. In some embodiments, the channel structure 120 may include a top S/D region (not shown), a channel region (not shown) and a bottom S/D region (not shown) serially connected in the vertical direction and thus be configured to have a current flow path in vertical direction. Accordingly, the top S/D region, the channel region and the bottom S/D region can be in direct contact with the S/D layer 117, the outer gate structure 140a and the S/D layer 113 respectively. Therefore, the channel structure 120, the outer gate structure 140a and the S/D layers 113 and 117 can be configured to function as a vertical gate-all-around (GAA) transistor.

As has been mentioned before, the channel structure 120 includes one or more 2D semiconductor materials. "2D semiconductor material" as used in the present disclosure generally refers to a semiconductor material with a thickness on the atomic scale, typically in the form of a single layer (or monolayer) of atoms. For example, a 2D semiconductor material may include a transition-metal dichalcogenide (TMDC). A TMDC can have a chemical formula of $MX_2$, where M includes a transition metal from Group VI, Group V or Group VI of the periodic table while X includes a chalcogen such as sulfur (S), selenium (Se) or tellurium (Te). More specifically, a 2D semiconductor material can include a W-based 2D material (e.g. $WS_2$, $WSe_2$ or WTe2), a Mo-based 2D material (e.g. $MoS_2$, $MoSe_2$ or MoTe2), $HfS_2$, $ZrS_2$, $TiS_2$ or the like. A 2D semiconductor material may also include a different kind of metal chalcogenides, such as a metal monochalcogenide (e.g. GaSe, InSe or SnS), a metal trichalcogenide (e.g. $TiS_3$) or the like. Further, a 2D semiconductor material can include a carbon-based material (e.g. graphene), a semiconducting oxide (e.g. ZnO, CdO or $In_2O_3$), hexagonal boron nitride (h-BN) or the like.

Note that such monolayers can have large surface areas and high surface-to-volume ratios. Moreover, multiple monolayers can be stacked to form a layered crystal structure with strong in-plane bonds and show layer-dependent properties. Hence, a 2D semiconductor material can have a high degree of anisotropy and thus have distinct chemical properties from traditional (e.g. bulk) semiconductor materials. For example, a 2D semiconductor material need not be formed by epitaxial growth (or epitaxial deposition) and yet may be crystalline. Stacking of such monolayers are not necessarily limited or constrained by conventional lattice-matching requirements. Ergo, a 2D semiconductor material can be formed on a non-crystalline layer, such as a dielectric layer or a dielectric substrate. A 2D semiconductor material can be formed by techniques including, but not limited to, atomic layer deposition (ALD), chemical vapor deposition (CVD), chemical exfoliation, hydrothermal synthesis and thermal decomposition. Additionally, a 2D semiconductor material can exhibit distinct optical and/or electrical properties from traditional semiconductor materials, such as having higher carrier mobility than a silicon- or germanium-based semiconductor material.

Referring back to FIG. 1A, the channel structure 120 includes one or more 2D semiconductor materials. Each of the one or more 2D semiconductor materials can include one or more monolayers stacked horizontally (e.g. in a direction within the XY plane), with each monolayer oriented substantially in the vertical direction (e.g. in the Z direction). A thickness of the channel structure 120 is dictated by the overall number of monolayers and/or the manner of stacking. For example, the channel structure 120 can be as thin as a monolayer of atoms, or as thick as a few nanometers, or thicker still. The thickness of the channel structure 120 can be controlled by corresponding formation (or deposition) conditions. Further, the channel structure 120 can have a uniform thickness and therefore have a conformal profile relative to the stack 110a of layers outside or the core structure 130a inside. While not shown, the channel structure 120 can have a circular, elliptical, polygonal or any irregular shape in a plane (e.g. the XY plane) parallel to a main surface of the stack 110a of layers.

Further, the core structure 130a is positioned inside and surrounded by the channel structure 120 (thus also referred to as the shell structure 120). In this example, the core structure 130a includes a dielectric core inside the channel structure 120. The dielectric core can include one or more dielectric materials, such as a high-k dielectric 131a and another dielectric 133a. Similarly, the core structure 130a can have a circular, elliptical, polygonal or any irregular shape in the plane parallel to the main surface of the stack 110a of layers.

In some embodiments, the semiconductor device 100A can include a base 101 positioned immediately below the channel structure 120 and the stack 110a of layers. The base 101 can, for example, be a substrate or a layer positioned over a substrate. Since a 2D semiconductor material need not be formed by epitaxial growth, the base 101 can include any suitable material, such as a dielectric material in one embodiment or a semiconductor material in another embodiment.

FIG. 1B shows a vertical cross-sectional view of a semiconductor device 100B, in accordance with another embodiment of the present disclosure. Since the embodiment of the semiconductor device 100B herein is similar to the embodiment of the semiconductor device 100A in FIG. 1A, descriptions herein will be given with emphasis placed on differences.

As shown in FIGS. 1A and 1B, the semiconductor device 100B includes a stack 110b of layers including a dielectric layer 155 instead of the outer gate structure 140a. The dielectric layer 155 surrounds part of the channel structure 120 from outside. The stack 110b of layers defines a sidewall surface 119b that corresponds to the sidewall surface 119a.

Moreover, the semiconductor device 100B includes a core structure 130b which is also referred to as an inner gate structure 140b. That is, the inner gate structure 140b is positioned inside the channel structure 120 and surrounds the channel structure 120 from within. As illustrated, the inner gate structure 140b includes one or more WFMs 133b and one or more gate dielectrics 131b (e.g. high-k dielectrics), with the one or more gate dielectrics 131b sandwiched between the one or more WFMs 133b and the channel structure 120. The inner gate structure 140b can have a circular, elliptical, polygonal or any irregular shape in a plane (e.g. the XY plane) parallel to a main surface of the stack 110b of layers.

As previously mentioned, in some embodiments, the channel structure 120 may include a channel region. Herein, the channel region can be in direct contact with the inner gate structure 140b. Therefore, the channel structure 120, the inner gate structure 140b and the S/D layers 113 and 117 can be configured to function as a vertical GAA transistor.

FIG. 1C shows a vertical cross-sectional view of a semiconductor device 100C, in accordance with yet another embodiment of the present disclosure. Since the embodiment of the semiconductor device 100C herein is similar to the embodiment of the semiconductor device 100A in FIG. 1A and the embodiment of the semiconductor device 100B in FIG. 1B, descriptions herein will be given with emphasis placed on differences.

As shown in FIGS. 1A, 1B and 1C, the semiconductor device 100C includes the stack 110a of layers including the outer gate structure 140a, in addition to the inner gate structure 140b. The outer gate structure 140a and the inner gate structure 140b may include one or more identical WFMs or different WFMs. Having two gate structures inside and outside the channel structure 120 can increase current capacity. In one example, the outer gate structure 140a and the inner gate structure 140b are electrically connected to be configured at a same electric potential. In another example, the outer gate structure 140a and the inner gate structure 140b are configured at different electric potentials and independently controlled.

FIG. 1D shows a vertical cross-sectional view of a semiconductor device 100D in accordance with yet another embodiment of the present disclosure. Since the embodiment of the semiconductor device 100D herein is similar to the embodiment of the semiconductor device 100A in FIG. 1A, descriptions herein will be given with emphasis placed on differences.

As shown in FIGS. 1A and 1D, the semiconductor device 100D includes a core structure 130d instead of the core structure 130a. The core structure 130d includes at least one 2D semiconductor material. For example, the core structure 130d and the channel structure 120 may include a same 2D semiconductor material and be integrally (or unitarily) formed. Accordingly, the core structure 130d and the channel structure 120 may collectively be referred to as a solid channel structure. Note that such a solid channel structure can help shrink a size (e.g. a lateral dimension in the XY plane) of the channel structure 120 and thus facilitate device miniaturization.

Note that in the examples of FIGS. 1A-1D, two similar stacks of layers are shown for illustrative purposes. It should be understood that any number of stacks of layers can be positioned on the base 101 and spaced apart from each other. The (any number of) stacks of layers, corresponding channel structures and/or corresponding core structures may be similar to or different from each other.

FIG. 2 shows a flow chart of a process 200 for manufacturing a semiconductor device, such as the semiconductor device 100A, 100B, 100C, 100D or the like, in accordance with exemplary embodiments of the present disclosure. The process 200 starts with Step S210 where a stack of layers is formed which defines a sidewall surface and includes source and drain layers. In some embodiments, an initial stack of layers is formed. The initial stack of layers includes sacrificial layers and dielectric layers. The sacrificial layers are separated from each other by the dielectric layers. In some embodiments, the initial stack of layers is directionally etched to form at least one independent stack which defines an initial sidewall surface. The sacrificial layers are replaced, from the initial sidewall surface, with the source and drain layers or with the source and drain layers and an outer gate structure. In some embodiments, the stack of layers is formed on a base which includes a dielectric material or a semiconductor material.

The process 200 then proceeds to Step S220 by forming a channel structure that extends through the stack of layers. The channel structure is oriented in a vertical direction perpendicular to a main surface of the stack of layers, and is configured to have a current flow path in the vertical direction. Note that the channel structure includes one or more two-dimensional (2D) semiconductor materials. In some embodiments, the channel structure is formed on a sidewall of a hole that extends through the stack of layers. For example, the channel structure can be formed by forming one or more monolayers of the one or more 2D semiconductor materials on the sidewall of the hole. The hole can be formed by directionally etching through the initial stack of layers.

At Step S230, a core structure is formed that is positioned inside and surrounded by the channel structure. At Step S240, a gate structure is formed that surrounds at least part of the channel structure. In some embodiments, the aforementioned hole is filled with the core structure after the channel structure is formed on the sidewall of the hole. In one embodiment, the core structure is formed by forming an inner gate structure of the gate structure inside the channel structure. In another embodiment, the core structure is formed by forming a dielectric core inside the channel structure. In yet another embodiment, the core structure is formed by forming the 2D semiconductor material inside the channel structure.

FIGS. 3A, 3B, 3C, 3D and 3E show cross-sectional views of a semiconductor device 300 at various intermediate steps of manufacturing, in accordance with exemplary embodiments of the present disclosure. In some embodiments, the semiconductor device 300 can eventually become the semiconductor device 100A, 100B, 100C, 100D or the like.

Figure 3A:
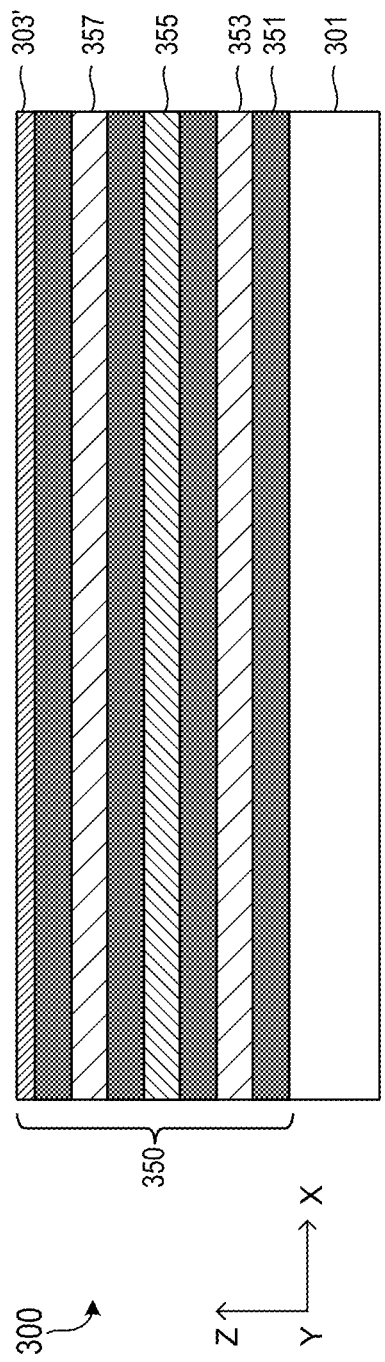
FIGS. 3A, 3B, 3C, 3D and 3E show cross-sectional views of a semiconductor device at various intermediate steps of manufacturing, in accordance with exemplary embodiments of the present disclosure.

As shown in FIG. 3A, the semiconductor device 300 includes a base 301. An initial stack 350 of layers is formed over the base 301. The initial stack 350 of layers includes dielectric layers 351 and sacrificial layers 353, 355 and 357. The dielectric layers 351 separate the sacrificial layers 353, 355 and 357 from each other. The initial stack 350 of layers also includes an initial capping layer 303' formed over the sacrificial layers 353, 355 and 357 and the dielectric layers 351. Herein, the base 301 corresponds to the base 101 in FIG. 1A. The dielectric layers 351 correspond to the dielectric layers 151. The initial capping layer 303' can eventually become the capping layer 103. The initial stack 350 of layers can later be divided and eventually become the stacks (e.g. 110a and 110a') of layers.

Figure 3B:
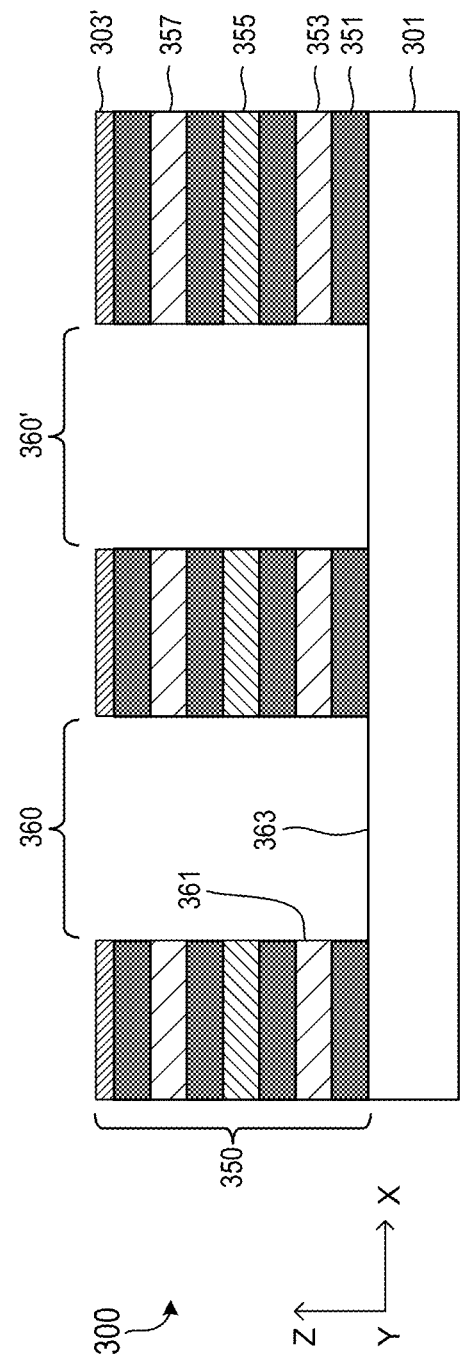

In FIG. 3B, holes (e.g. 360 and 360') are formed that extend through the initial stack 350 of layers and expose the base 301, for example by a directional etching process. Consider the hole 360 for example. The hole 360 defines a sidewall 361 and a bottom 363. The hole 360 can have a circular, elliptical, polygonal or any irregular shape in a plane (e.g. the XY plane) parallel to a main surface of the initial stack 350 of layers.

Figure 3C:
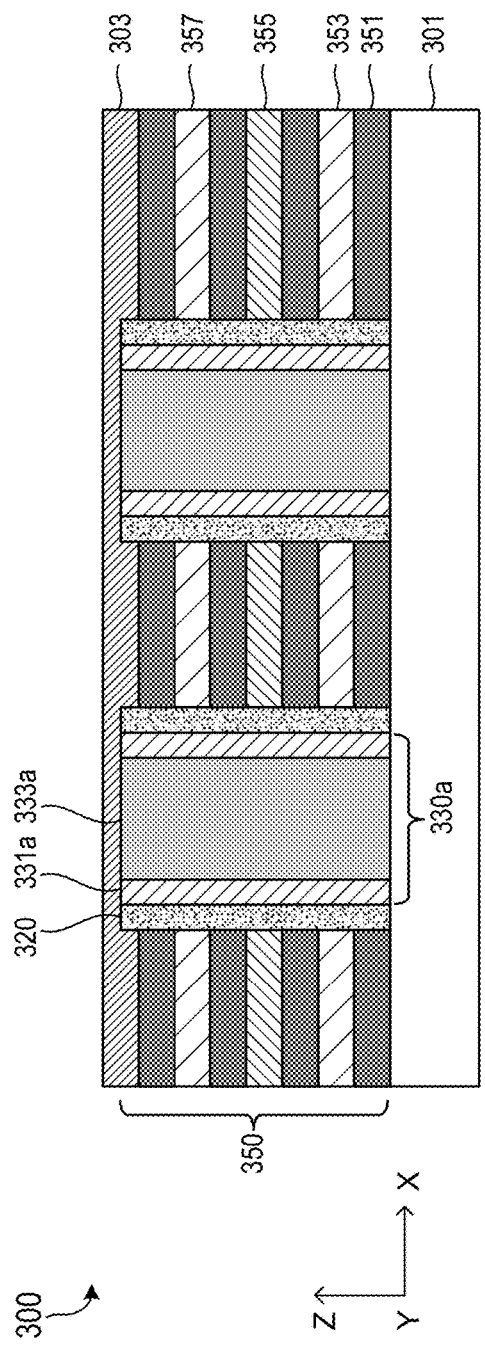

In FIG. 3C, a channel structure 320 and a core structure 330a are formed in the hole 360. Another layer which includes a same material as the initial capping layer 303' can be deposited over the initial stack 350 to form the capping layer 303. In this example, the channel structure 320 corresponds to the channel structure 120 and thus includes one or more 2D semiconductor materials. The core structure 330a corresponds to the core structure 130a. The capping layer 303 corresponds to the capping layer 103.

Specifically, the channel structure 320 is formed on the sidewall 361 of the hole 360. In a non-limiting example, a conformal layer of the one or more 2D semiconductor materials is deposited by atomic layer deposition (ALD). The conformal layer can include one or more monolayers of the one or more 2D semiconductor materials. While not shown, the conformal layer can include horizontal portions covering the initial capping layer 303' and the bottom 363 of the hole 360, in addition to a vertical portion covering the sidewall 361 of the hole 360. Subsequently, a directional etching process (e.g. in the Z direction) can be executed to remove the horizontal portions in order that a remaining portion of the conformal layer forms the channel structure 320.

Then, the hole 360 is filled with the core structure 330a, such as a dielectric core. For example, a high-k dielectric 331a can be deposited to seal an exposed interface (e.g. an inner sidewall) of the channel structure 320, followed by deposition of another dielectric 333a.

Figure 3D:
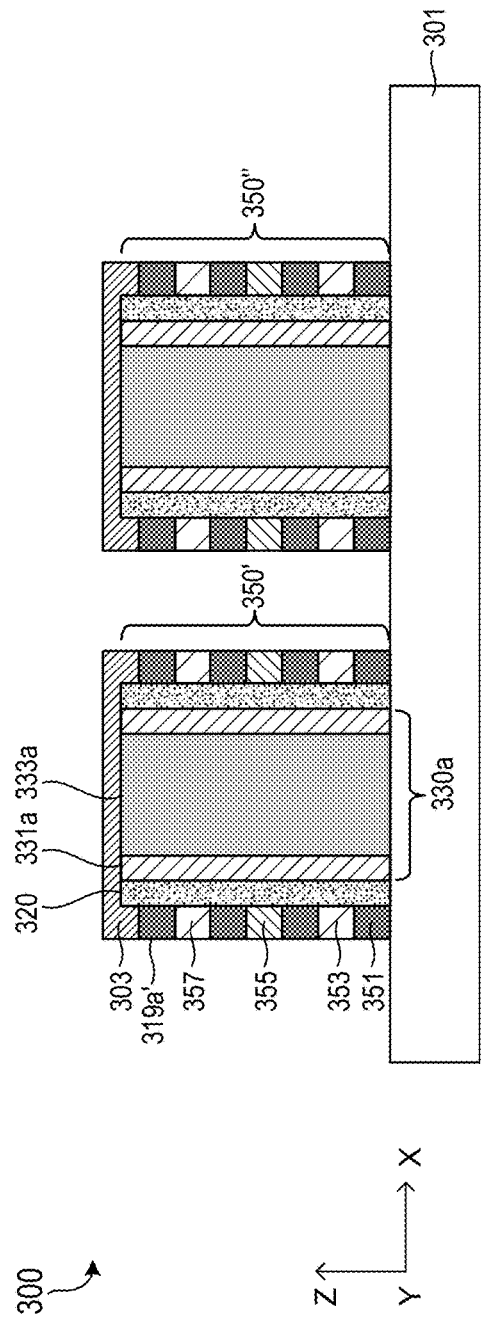
Figure 3E:
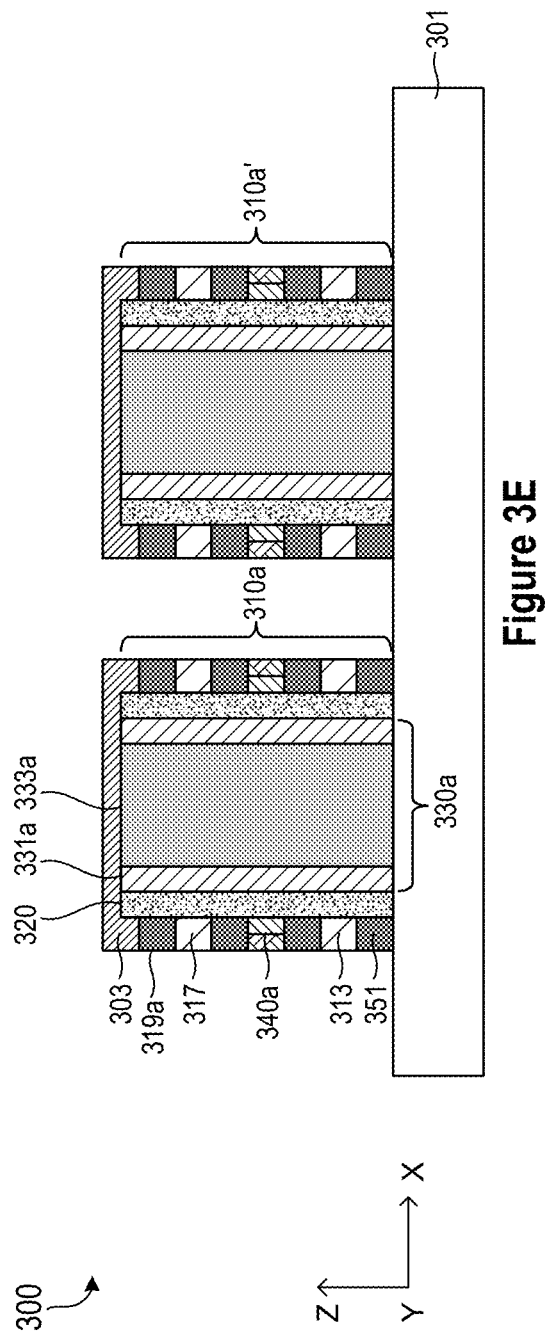

In FIG. 3D, the initial stack 350 of layers is directionally etched to form at least one independent stack (e.g. 350' and 350"). Consider the independent stack 350' for example. In FIG. 3E, the sacrificial layers 353, 355 and 357 are replaced, from an initial sidewall surface 319a' defined by the independent stack 350', with an S/D layer 313, an outer gate structure 340a and an S/D layer 317 respectively.

As a result, a stack 310a of layers is formed that defines a sidewall surface 319a. Herein, the stack 310a of layers corresponds to the stack 110a of layers. The sidewall surface 319a corresponds to the sidewall surface 119. The S/D layers 313 and 317 respectively correspond to the S/D layers 113 and 117. The outer gate structure 340a corresponds to the outer gate structure 140a.

In some embodiments, the sacrificial layers 353 and 357 include a same material and are removed in a same etching process before the S/D layers 313 and 317 are formed, for instance by a selective deposition process. An isotropic etching process may be executed to remove excessive material deposited on unwanted surfaces to ensure high selectivity. Similarly, the sacrificial layer 355 can be removed in another etching process before the outer gate structure 340a is formed, for instance by selective deposition and maybe isotropic etching as well. Note that the sacrificial layer 355 is configured to be etch-selective to the sacrificial layers 353 and 357 so that the outer gate structure 340a can be formed separately.

While not shown, it should be understood that additional steps can be provided to further process the semiconductor device 300 shown in FIG. 3E. For example, an insulating layer, which corresponds to the insulating layer 105, can be formed over the base 301 to cover the stacks 310a and 310a', for instance by a deposition process followed by a chemical mechanical polishing process. As a result, the semiconductor device 300 can eventually become the semiconductor device 100A in FIG. 1A.

Note that FIGS. 3A-3E show an embodiment where the semiconductor device 300 is processed to form the semiconductor device 100A. In another embodiment, the semiconductor device 300 can also be processed to form the semiconductor device 100B. Specifically, the semiconductor device 300 can go through steps shown in FIGS. 3A and 3B. Then, the channel structure 320 is deposited on the sidewall 361 of the hole 360. Next, a core structure (not shown), which corresponds to the core structure 130b, is formed inside the channel structure 320 by forming an inner gate structure (not shown) which corresponds to the inner gate structure 140b. Subsequently, the semiconductor device 300 can go through steps shown in FIGS. 3D and 3E, except that the sacrificial layer 355 is not replaced. Note that the sacrificial layer 355 can include a dielectric material and correspond to the dielectric layer 155. Then, an insulating layer that corresponds to the insulating layer 105 is formed.

In yet another embodiment, the semiconductor device 300 can be processed to form the semiconductor device 100C. Specifically, the semiconductor device 300 can go through steps shown in FIGS. 3A and 3B. Then, the channel structure 320 is deposited on the sidewall 361 of the hole 360. Next, a core structure (not shown), which corresponds to the core structure 130b, is formed inside the channel structure 320 by forming an inner gate structure (not shown) which corresponds to the inner gate structure 140b. Subsequently, the semiconductor device 300 can go through steps shown in FIGS. 3D and 3E before an insulating layer that corresponds to the insulating layer 105 is formed.

In yet another embodiment, the semiconductor device 300 can be processed to form the semiconductor device 100D. Specifically, the semiconductor device 300 can go through steps shown in FIGS. 3A and 3B. Then, the channel structure 320 is deposited on the sidewall 361 of the hole 360. Next, a core structure (not shown), which corresponds to the core structure 130d, is formed inside the channel structure 320. Note that the channel structure 320 and the core structure may be formed in a continuous process (e.g. a same process) or separate processes. Subsequently, the semiconductor device 300 can go through steps shown in FIGS. 3D and 3E before an insulating layer that corresponds to the insulating layer 105 is formed.

Further, in the above descriptions regarding FIGS. 3A-3E, the channel structure 320 and a corresponding core structure (e.g. 330a) are formed before the initial stack 350 of layers is divided into at least one independent stack (e.g. 350'), after which the sacrificial layers (e.g. 353, 355 and 357) are replaced to form the stack (e.g. 310) of layers. While not shown, in alternative embodiments, the initial stack 350 of layers can firstly be divided into at least one independent stack (e.g. 350'). Secondly, the sacrificial layers (e.g. 353, 355 and 357) are replaced to form the stack (e.g. 310) of layers. Thirdly, the channel structure 320 and a corresponding core structure (e.g. 330a) can be formed.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a stack of layers defining a sidewall surface and comprising source and drain layers;
a channel structure extending through the stack of layers, oriented in a vertical direction perpendicular to a main surface of the stack of layers, and configured to have a current flow path in the vertical direction, wherein the channel structure comprises a two-dimensional (2D) semiconductor material;
a core structure positioned inside and surrounded by the channel structure; and
a gate structure surrounding at least part of the channel structure.

2. The semiconductor device of claim 1, wherein:
the core structure comprises a dielectric core inside the channel structure.

3. The semiconductor device of claim 1, wherein:
the core structure comprises the 2D semiconductor material.

4. The semiconductor device of claim 1, wherein:
the core structure comprises an inner gate structure of the gate structure surrounding the channel structure from within.

5. The semiconductor device of claim 1, wherein:
the gate structure comprises an outer gate structure surrounding part of the channel structure from outside.

6. The semiconductor device of claim 1, wherein:
the channel structure includes one or more monolayers of the 2D semiconductor material, the one or more monolayers stacked in a horizontal direction parallel to the main surface of the stack of layers.

7. The semiconductor device of claim 1, wherein:
the 2D semiconductor material includes at least one of hexagonal boron nitride, a carbon-based material, a semiconducting oxide, or a metal chalcogenide.

8. The semiconductor device of claim 7, wherein:
the carbon-based material includes graphene, and
the semiconducting oxide includes at least one of ZnO, CdO or $In_2O_3$, and
the metal chalcogenide includes at least one of $WS_2$, $WSe_2$, $WTe_2$, $MoS_2$, $MoSe_2$, $MoTe_2$, $HfS_2$, $ZrS_2$, $TiS_2$, GaSe, InSe or $TiS_3$.

9. The semiconductor device of claim 1, further comprising:
a base positioned immediately below the channel structure, the base comprising a dielectric material or a semiconductor material.

10. The semiconductor device of claim 1, wherein:
the gate structure comprises a work function metal (WFM) and a gate dielectric positioned between the WFM and the channel structure.

11. A method of fabricating a semiconductor device, the method comprising:
forming a stack of layers which defines a sidewall surface and comprises source and drain layers;
forming a channel structure that extends through the stack of layers, is oriented in a vertical direction perpendicular to a main surface of the stack of layers, and is configured to have a current flow path in the vertical direction, wherein the channel structure comprises a two-dimensional (2D) semiconductor material;
forming a core structure positioned inside and surrounded by the channel structure; and
forming a gate structure surrounding at least part of the channel structure.

12. The method of claim 11, further comprising:
forming the channel structure on a sidewall of a hole that extends through the stack of layers.

13. The method of claim 12, further comprising:
filling the hole with the core structure.

14. The method of claim 13, further comprising:
forming the core structure by forming an inner gate structure of the gate structure inside the channel structure.

15. The method of claim 13, further comprising:
forming the core structure by forming a dielectric core inside the channel structure.

16. The method of claim 13, further comprising:
forming the core structure by forming the 2D semiconductor material inside the channel structure.

17. The method of claim 12, further comprising:
forming an initial stack of layers including sacrificial layers and dielectric layers, the sacrificial layers separated from each other by the dielectric layers; and
directionally etching through the initial stack of layers to form the hole.

18. The method of claim 17, further comprising:
directionally etching the initial stack of layers to form at least one independent stack which defines an initial sidewall surface; and
replacing, from the initial sidewall surface, the sacrificial layers with the source and drain layers or with the source and drain layers and an outer gate structure of the gate structure.

19. The method of claim 12, further comprising:
forming the channel structure by forming one or more monolayers of the 2D semiconductor material on the sidewall of the hole.

20. The method of claim 11, further comprising:
forming the stack of layers on a base, the base comprising a dielectric material or a semiconductor material.

* * * * *